United States Patent [19]

Chang-Hasnain

[11] Patent Number: 5,029,176
[45] Date of Patent: Jul. 2, 1991

[54] MONOLITHIC MULTIPLE-WAVELENGTH LASER ARRAY

[75] Inventor: Constance J. Chang-Hasnain, Edison, N.J.

[73] Assignee: Bell Communications Research, Inc., Livingston, N.J.

[21] Appl. No.: 522,226

[22] Filed: May 11, 1990

[51] Int. Cl.$^5$ ............................................. H01S 3/19
[52] U.S. Cl. ...................................... 372/50; 372/45
[58] Field of Search ............................ 372/45, 46, 50

[56] References Cited

U.S. PATENT DOCUMENTS 4,949,350  8/1990  Jewel et al. ............................ 372/45

OTHER PUBLICATIONS

M. Nakao et al., "1.5 μm DBF Laser Array with λ/4--Shifted First-Order Gratings Fabricated by X-Ray Lithography", *Electronics Letters*, vol. 25, Jan. 19, 1989, pp. 148-149.

K. Tai et al., "Use of Implant Isolation for Fabrication of Vertical Cavity Surface-Emitting Laser Diodes", *Electronics Letters*, vol. 25, No. 23, 1989, pp. 1644-1645.

D. E. Bossi et al., "Reduced-Confinement Antennas for GaAlAs Integrated Optical Waveguides", *Applied Physics Letters*, vol. 56, Jan. 29, 1990, pp. 420-422.

K. M. Dzurko et al., "Temperature Engineered Growth of Low-Threshold Quantum Well Lasers by Metalorganic Chemical Vapor Deposition", *Applied Physics Letters*, vol. 54, pp. 105-107, Jan. 9, 1989.

*Primary Examiner*—Georgia Epps
*Attorney, Agent, or Firm*—James W. Falk; Leonard Charles Suchyta; Charles S. Guenzer

[57] ABSTRACT

A one or two dimensional integrated array of multiple-wavelength, vertical-cavity lasers and its method of making. All lasers are simultaneously formed on a common substrate by the sequential vertical growth of a lower reflector, a lower spacer, an active light emitting region, an upper spacer and an upper reflector. Resonant cavities are formed between the upper and lower reflectors, the optical lengths of which determine the lasing wavelengths. According to the invention, during the growth of at least part of this vertical structure, the growth is made controllably non-uniform over the substrate, thereby providing a spatial variation over the substrate of the resonant cavity length. Such non-uniform deposition may be achieved by deposition from an off-normal source onto a stationary substrate, by thermal gradients in the substrate or by diffusion limited growth onto mesas or valleys of different widths.

9 Claims, 2 Drawing Sheets

MONOLITHIC MULTIPLE-WAVELENGTH LASER ARRAY

FIELD OF THE INVENTION

The invention relates generally to optical devices. In particular, the invention relates to an integrated array of surface-emitting semiconductor lasers having regularly spaced emission frequencies and to its method of making.

BACKGROUND OF THE INVENTION

Vertical-cavity, surface-emitting laser arrays offer many advantages for applications in optical communications, optical interconnects, optical neural networks and optical signal processing. Moreover, recent publications have demonstrated that such vertical-cavity, surface-emitting laser arrays can be made in a highly dense array and with low threshold currents.

Jewell et al disclosed such an advanced two-dimensional array of vertical-cavity, surface-emitting lasers in a technical article entitled "Low threshold electrically pumped vertical-cavity surface emitting microlasers" appearing in Electronics Letters, volume 25, 1989 at pages 1123–1124. Further details of the Jewell et al array are found in U.S. patent application, Ser. No. 07/380,996, filed July 17, 1989, now issued as U.S. Pat. No. 4,949,350, and incorporated herein by reference. Jewell et al grew a vertical epitaxial semiconductor structure consisting of upper and lower distributed Bragg reflectors separated by an optical distance equal to the lasing wavelength to form a vertical resonant cavity. An active quantum well layer was placed in the middle of the cavity. After this planar structure was grown, the array of lasers was defined by an etching process. Electrical current was passed vertically through a selected laser, causing it to emit light vertically.

There are numerous variations of this basic structure and its fabrication procedure appearing in the literature. However, all known references to arrays of vertical-cavity, surface-emitting lasers have attempted to fabricate arrays with a uniform lasing frequency, which follows from the initial uniform growth of the vertical structure prior to lateral definition. However, there are several applications which can advantageously use one or two dimensional arrays of lasers having separate laser frequencies. Examples of such systems are wavelength division multiplexing (WDM) optical communication systems and optical signal processors. For example, in a WDM system, each laser would be modulated by a data channel and would emit at a separate optical carrier frequency assigned to that channel. All optical outputs would be combined on one optical fiber for WDM transmission.

A multiple-wavelength, edge-emitting (horizontal-cavity) laser array has been disclosed by Nakao et al in a technical article entitled "1.55 $\mu$m DFB laser array with $\lambda/4$-shifted first-order gratings fabricated by x-ray lithography", appearing in Electronics Letters, volume 25, 1989 at pages 148–149. The wavelength dependence was achieved by x-ray lithographic definition of cavity gratings of slightly different periods. Such a lithographic approach fails for a vertical-cavity structure in which all the reflectors are simultaneously deposited in a single growth sequence and the peak wavelength of their reflectance is determined by the layer thicknesses.

Tai et al have disclosed a type of vertical-cavity laser array in a technical article entitled "Use of implant isolation for fabrication of vertical cavity surface-emitting laser diodes" appearing in Electronics Letters, volume 25, 1989 at pages 1644–1645. They reported that their lasers had lasing wavelengths ranging from 863 to 854 nm. They ascribed the variation to nonuniform layer thickness across the wafer grown by their MBE (molecular beam epitaxy) method.

In MBE, the particle sources, called effusion cells, are located a few tens of centimeters from the substrates and located at a substantial angle off the normal of the substrate. It is well known that geometrical and other effects cause a non-uniform deposition on stationary substrates, producing varying layer thicknesses. Thus, the standard practice in MBE growth, particularly of devices having critical thicknesses, such as vertical-cavity lasers, is to rotate the substrate during MBE deposition so that all parts of the wafer are exposed to nearly the same distribution of angles of deposition. Nonetheless, as reported by Tai et al, layer uniformities do remain.

SUMMARY OF THE INVENTION

Accordingly, it is an object of the invention to provide an array of surface-emitting, vertical-cavity lasers in which the lasers have a controlled distribution of lasing wavelengths.

It is a further object to provide such an array in which the lasers have a controlled distribution of lasing wavelengths over a two dimensional array.

The invention can be summarized as an array of multiple-wavelength, vertical-cavity, surface-emitting laser diodes and its method of making in which the cavity length is controllably varied over the extent of the array by relying on a spatially non-uniform growth of at least one part of the cavity structure, for instance, by stopping rotation of the substrate during MBE growth, by a thermal gradient across the substate, or by growing on mesas or valleys of varying width.

DETAILED DESCRIPTION

Figure 1:
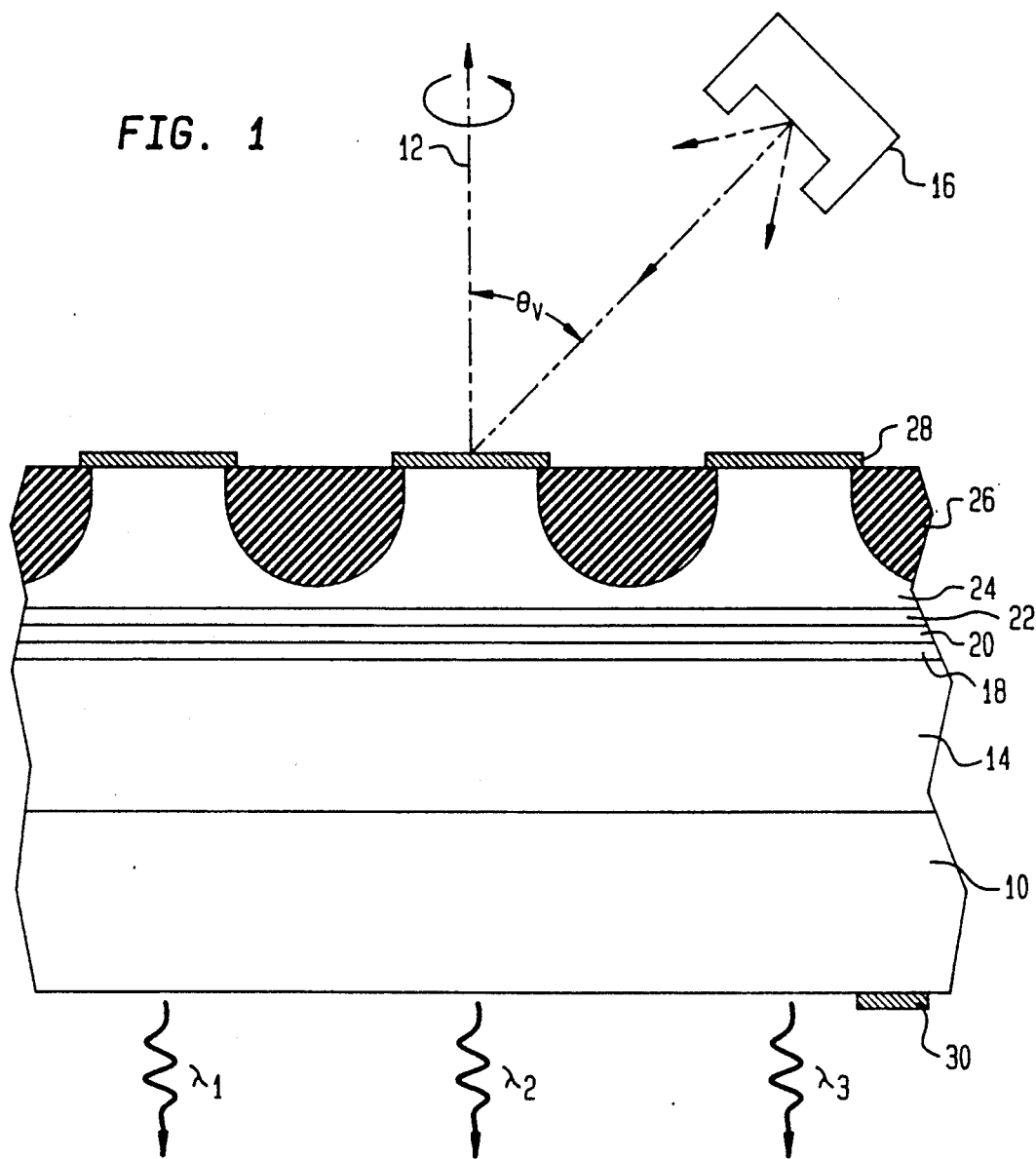
FIG. 1 is a cross-sectional view of a first embodiment of the invention, a linear array of multiple-wavelength lasers.

A first embodiment of the invention is an integrated linear array of diode lasers having separate emission wavelengths. Such a linear array of eight laser diodes was fabricated and tested. A partial cross-section is illustrated in FIG. 1. The technical article and patent to Jewell et al should be consulted for details of the fabrication. The following description highlights the important steps that are variants from the Jewell et al procedure.

A 2 inch (5 cm) n+ substrate 10 of GaAs was loaded into a Varian GEN-II MBE (molecular beam epitaxy) growth chamber. During most of the MBE growth, the substrate 10 was rotated at 60 r.p.m. about its normal axis 12 by a motor-driven rotary substrate holder, which is standard equipment in the MBE unit. This rotation provided uniform thickness over the substrate 10.

An n-type, lower Bragg reflector 14 was epitaxially grown over the substrate 10 and comprised 14 pairs of n-type GaAs and n-type AlAs layers, each of optical thickness $\lambda_o/4$. The optical thickness is shorter than the physical thickness by a factor equal to the refractive index n of the material. The nominal lasing wavelength $\lambda_o$ used in controlling the MBE growth was 940 nm. During the deposition of the lower 12 pairs, the substrate 10 was rotated. However, during deposition of the upper two pairs (including the associated superlattices described by Jewell et al), the rotation of the substrate 10 was stopped at the point that the Ga or Al effusion cell 16 was aligned with the eventually formed linear array, as viewed within the plane of the substrate 10. The effusion cell 16 was located about 5 inches (12.5 cm) away from the substrate 10 with its beam directed at the substrate 10 but was located off the substrate normal 12 at an angle $\theta_y$ of about 33°. There were, in fact, separate effusion cells 16 for the Ga and for the Al. However, they were located next to each other on a 33° cone surrounding the substrate normal 12. Accordingly, the alignment was made to a position between them and the Ga and Al effusion cells were activated without further rotation of the substrate 10. The geometric effects of the two closely spaced positions should have been nearly the same. The angular location of the As effusion cell was relatively unimportant because the MBE growth is performed in an excess-As environment and was thus controlled by the amount of Al and/or Ga. The growth conditions for these last two pairs of layers, other than the substrate rotation, were the same so that their optical thicknesses averaged over the whole wafer were also $\lambda_o/4$. However, it is estimated that there was a nearly linear 12 to 15% variation in thicknesses of these two pairs of layers across the 2 inch wafer.

Thereafter, the substrate 10 was again spun and a lower spacer 18, an active region 20 and an upper spacer 22 were grown. The lower spacer 18 was n-type while the upper spacer 22 was p-type. The active region 20 consisted of three strained quantum well layers of $In_{0.2}Ga_{0.8}As$ sandwiched between five barrier layers.

An upper, p-type Bragg reflector 24 was grown over the upper spacer 22. This reflector 24 comprised 20 pairs of a p-type GaAs layer and a p-type AlAs layer, each of nominal optical thickness $\lambda_o/4$. However, during the growth of the lower two pairs, the substrate rotation was stopped and the substrate 10 was again aligned with respect to the Al or Ga effusion cell 16, as was done for the upper two pairs of the lower reflector 14. Thereby, the same thickness variation was produced. During the deposition of the upper 18 pairs, the substrate 10 was again rotated.

After completion of the MBE growth, an unillustrated layer of AuBe/Au was evaporated and photolithographically patterned by liftoff in the intended shapes of the lasers in the array. Specifically, the AuBe/Au remained as unillustrated square p-metal contacts, 15 μm on a side with center-to-center spacings of 354 μm. More photoresist was spun on and patterned to exactly overlie the p-metal contact squares. The patterned photoresist and to a lesser extent the p-metal contacts acted as a implantation mask for a proton implantation having a dose of $3 \times 10^{15} cm^{-3}$ at 100 keV. The protons produced insulating regions 26 which acted to confine current to the areas beneath the p-metal contacts. The use of protons to confine current in a vertical-cavity, surface-emitting laser has been described by Orenstein et al in U.S. patent application, Ser. No. 07/480,117, filed Feb. 14, 1990. In a separate lithographic step, TiAu/Au contact pads 28 were deposited and defined over the p-metal contact squares. The contact pads 28 had a large enough size of about 150 μm to allow easy contacting with a microprobe away from the area directly overlying the respective laser. The back side of the substrate 10 was polished to a mirror-like surface with a bromine/methanol solution. Finally, an n-metal contact 30 of AuGe/Au was applied to the back side of the substrate 10 in an area remote from the lasers. In an operational device, unillustrated bonding wires or other leads would be attached to the contact pads 28 and the n-metal contact 30.

The separate lasers were tested by passing an electrical current between a selected contact pad 28 and the n-metal contact 30. Laser light of wavelength λ was emitted through the substrate 10. The thicknesses of the spacers 18 and 22 and the phase of the reflectors 14 and 24 were such that an optical cavity of nominal optical length $\lambda_o/2$ was formed between the reflectors 14 and 24 with the quantum well layers centered in the cavity. However, the linearly graded thicknesses of the two pairs of AlAs/GaAs layers in the reflectors 14 and 24 adjacent the spacers 18 and 22 had the effect of varying the effective length of the optical cavity. Although the reflectors 14 and 24 were separated by a constant optical distance $\lambda_o$ to the precision of our growth technique, the effective optical cavity length λ needs to account for the changed thicknesses of the first two periods of the Bragg reflectors 14 and 24. Calculations have shown a nearly linear dependence of the effective cavity length with thickness variations of ±15% for the two pairs of the AlAs and Gas quarter-wavelength layers on either end of the cavity, specifically Δλ=46 nm over the stated range. As a result, the array of lasers emitted at a distribution of λ centered about $\lambda_o$. Both the emission spectra of the quantum wells and the reflectance spectra of the Bragg reflectors are wide enough to not introduce appreciable effects over the ±15% thickness range.

TABLE 1

| Laser Number | Wavelength (nm) |
|---|---|
| 1 | 931.9 |
| 2 | 934.5 |
| 3 | 937.4 |
| 4 | 940.0 |
| 5 | 942.0 |
| 6 | 944.9 |
| 7 | 947.2 |
| 8 | 950.0 |

The measured emission wavelengths λ for the eight laser diodes in the array are given in Table 1. These wavelengths are derived from laser spectra measured near threshold under CW operation. The spectra linewidths were less than the measuring resolution of 0.008 nm. The lasers are numbered sequentially from one end of the array to the other, beginning with the side farthest from the effusion cell 16 during the non-rotating deposition. The wavelengths vary monotonically from one side of the array to the other and are nearly uniformly separated by an average of $\Delta\lambda=2.6$ nm. This value can be controlled by other means, such as by varying the amount of material deposited without spinning the substrate, by varying the spacing between the lasers, or by varying the angle of the effusion cell. The operating voltage was $\sim 3.5$V and the series resistance at threshold was $\sim 100\Omega$. Because of a lack of heat sinking, the wavelengths under CW operation were about 2 nm longer than those under pulsed operation. Despite the variation in emission wavelength, the lasers in the array had nearly the same threshold current (variations of $\pm 7\%$) and quantum efficiencies of 6 to 7%.

The performance of the laser array could be improved by providing heat sinking or by extending the current confinement region closer to the active region by a higher energy implant. It would be possible to introduce the thickness variations in other parts of the laser cavity, for example, in the spacers or even in the active region. However, our results show very uniform lasing characteristics, aside from the lasing wavelength, between the lasers. Varying the thickness of layers between the Bragg reflectors may reduce this desired uniformity.

Figure 2:
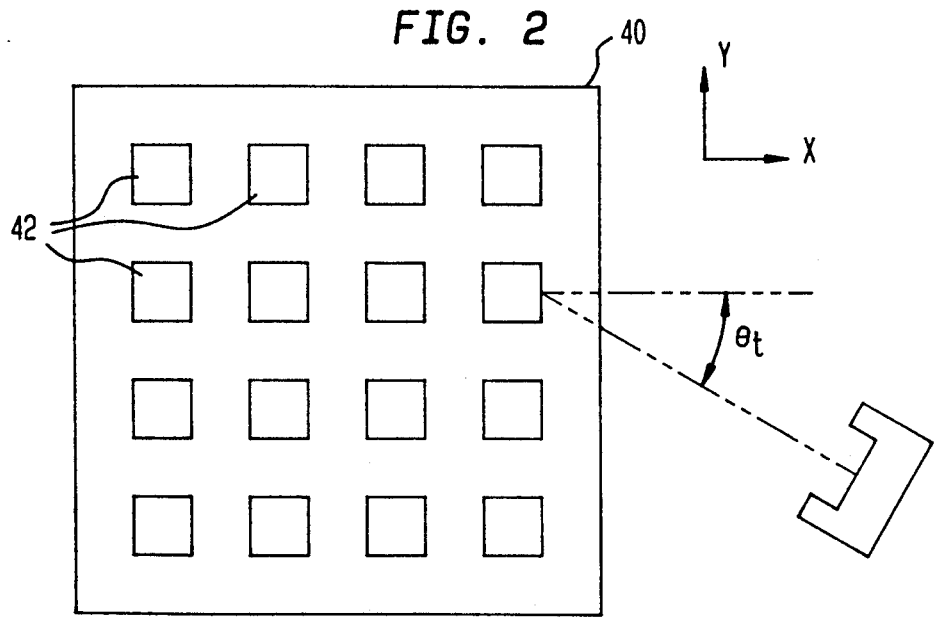
FIG. 2 is a plane view of a second embodiment of the invention, a two-dimensional array of multiple-wavelength lasers.

A second embodiment of the invention is partially illustrated in plan view in FIG. 2 and consisted of an 8×8 two-dimensional array 40 of lasers 42. The lasers 42 were 15 $\mu$m×15 $\mu$m and arranged on 254 $\mu$m centers in both the x and y directions. The two-dimensional array 40 was fabricated using the procedure described with reference to FIG. 1. However, during the MBE growth when the substrate was stationary, the substrate was aligned such the the Al or Ga effusion cell 16 was at an angle $\theta_t$ of 31° with respect to the x direction, as measured within the plane of the substrate.

The array 40 was tested and the characteristics were similar to those described above for the one-dimensional array. The wavelength separations were different in the x and y directions, specifically, $\Delta\lambda_x=0.98$ nm and $\Delta\lambda_y=1.59$ nm. Therefore, there was overlap between the rows in the distribution of $\lambda$. A more regular distribution of $\lambda$ could be obtained by placing the lasers 42 in a non-square, rectangular pattern ($\Delta x \neq \Delta y$) or a non-rectangular configuration. Alternatively, a small portion of a layer could be deposited with the effusion cell aligned along the x axis and a large portion of the same layer could be deposited with alignment along the y axis.

Another 7×11 array on 354 $\mu$m spacings was fabricated with 15 and 22 pairs of quarter-wavelength layers. Rotation was stopped only for one of the closest pairs. The alignment during non-rotating growth was $\theta_t=\tan^{-1}(\frac{1}{8})\approx 7°$. As a result, there was a nearly uniform wavelength separation of $\Delta\lambda=0.26$ nm in a raster pattern with no overlap in $\lambda$ between the rows and columns.

The invention has been described with reference to a particular type of vertical-cavity, surface-emitting laser. However, the invention is applicable to a much larger class of such lasers and optical devices. Different combinations of materials may be used to achieve lasing at different wavelengths. The active layer need not include quantum well layers. The semiconductor distributed Bragg reflectors may be replaced in whole or in part by dielectric Bragg reflectors or metallic reflectors. Growth techniques other than MBE may be used which can provide spatially dependent growth rates.

The two embodiments described above relied upon the geometric effect of an off-normal source to provide a controlled variation of layer thickness between different portions of a commonly grown layer. The same effect can be achieved in other ways.

Figure 3:
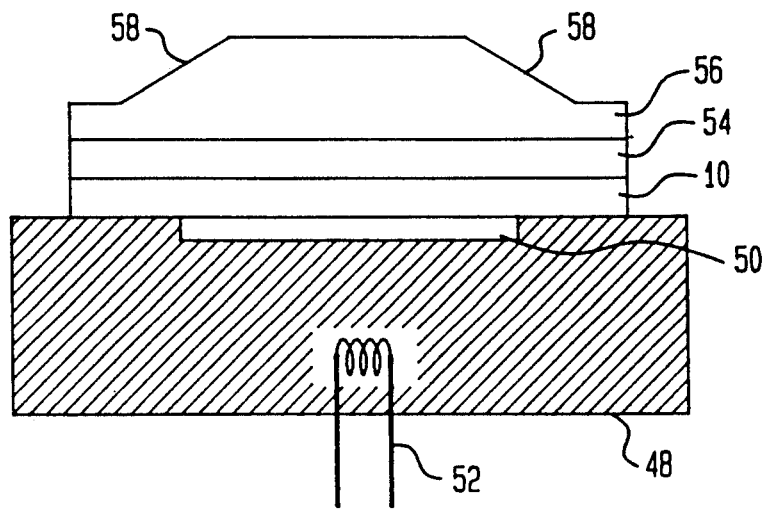
FIG. 3 is a cross-sectional view illustrative of a first alternative method of growing layers of varying thickness, specifically, thermal gradients.

It is known that thermal gradients introduced in a substrate can produce tapered surfaces, as has been disclosed by Bossi et al in a technical article entitled "Reduced-confinement antennas for GaAlAs integrated optical waveguides", appearing in Applied Physics Letters, volume 56, 1990 at pages 420–422. As illustrated in FIG. 3, a thermally conductive substrate holder 48 is formed with a recess 50 in its surface. The holder 48 is heated with a coil 52. The substrate 10 is positioned on the holder 48 bridging the recess 50 and thermally bonded to the flat portion of the holder 48. Over the flat portions of the holder 48, the substrate 10 is efficiently heated conductively while over the recess 50 it is less efficiently heated radiatively. Thereby, a thermal gradient is introduced in the substrate 10 near the edges of the recess 50.

If the temperatures are kept below a critical temperature, 650° C. for GaAlAs, the temperature gradient has minimal effect on the growth rate in MBE and a flat layer 54 is grown. However, if the temperature is raised above 650° C., the growth rate falls. Thus, the thermal gradient over the recess edges produces a growth-rate gradient and thus a variable-thickness layer 56 having tapered portions 58.

As applied to the laser arrays of the present invention, the flat layers of the vertical laser structure are deposited with the substrate 10 below the critical temperature. However, the variable-thickness layers (the innermost two pairs of quarter-wavelength layers in the embodiment of FIG. 1), are deposited with at least the portion of the substrate 10 thermally contacting the holder 48 held above the critical temperature. The laser array is then defined in one of the tapered portions 58 with the cavity length and thus the emission wavelength varying across that tapered portion 58.

Figure 4:
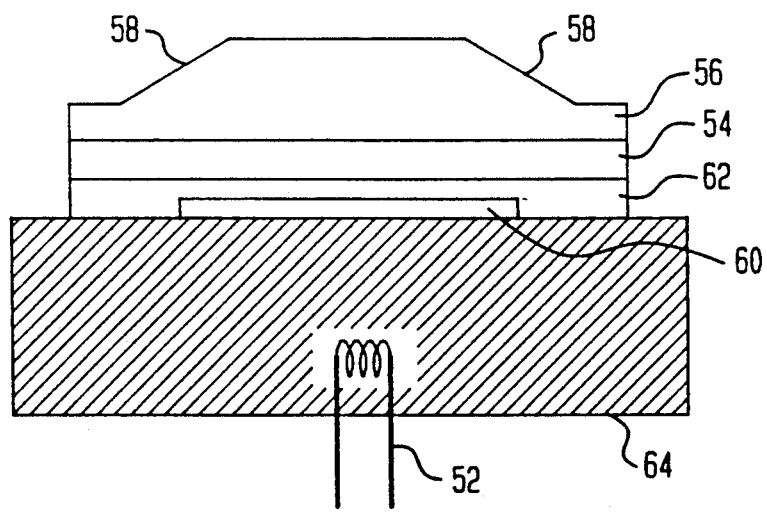
FIG. 4 is a cross-sectional view illustrative of a variation of the first alternative method.

A variant of the thermal gradient procedure is illustrated in the cross section of FIG. 4. A recess 60 is photolithographically formed in the back of a substrate 62. The planar portions of the substrate 62 are then thermally bonded to an unpatterned substrate holder 64. The thermal gradients produced near the edges of the substrate recess 60 produce the same type of uniform thickness layer 54 and variable thickness layer 56 as in FIG. 3.

Figure 5:
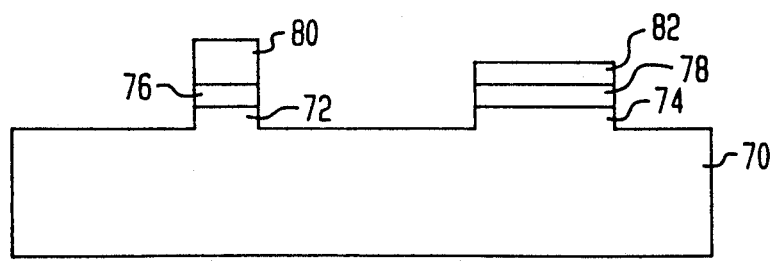
FIG. 5 is cross-sectional view illustrative of a second alternative method, specifically, diffusion limited growth on mesa.

Yet another method of growing a variable thickness layer relies on diffusion limited growth on mesas or in channels of differing diameters. As illustrated in cross-section in FIG. 5, a substrate 70 has its surface patterned with mesas 72 and 74 of different diameters. Below a critical temperature on a correctly oriented mesa, the mesa diameter has minimal effect on the growth. Therefore, layers 76 and 78 are grown on the two mesa 72 and 74 with the substrate 50 held uniformly below that temperature on an unpatterned substrate holder. However, above the critical temperature, the growth is diffusion limited and thus the growth rate is faster on the narrow mesa 72 than on the wider mesa 74. Thus, when the substrate 70 is held above the critical temperature, a simultaneous deposition produces a thick layer 80 on the narrow mesa 72 and a thin layer 82 on the wider mesa 74. The same effect can be achieved with growth in variable width valleys. The described temperature controlled, width-dependent growth rate is related to the temperature controlled, facet-dependent growth rate disclosed by Dzurko et al in a technical article entitled "Temperature engineered growth of low-threshold quantum well lasers by metalorganic chemical vapor deposition" appearing in Applied Physics Letters, volume 54, 1989 at pages 105-107.

As applied to the present invention, a long-wavelength laser is grown on the narrow mesa 72 and a short-wavelength laser is grown on the wide mesa 74 by a simultaneous sequence of layer depositions. During most of the growth, the substrate 70 is held below the critical temperature. However, for the variable-thickness layer, the temperature is raised.

The invention is applicable to arrays of other optical devices than lasers, for example, detectors and filters. If the active layer is removed and none of the layers are significantly doped, there results an array of multiple wavelength filters. Additionally, the filter structure can be combined with an array of detectors. On one side of the filter, there is grown a structure of a p-type layer of an integral number of quarter-wavelengths $\lambda_o/4$ and an n-type layer of an integral number of quarter-wavelengths and this structure is laterally defined, there results a p-n detector array. The detector layers may be fabricated with GaAs and GaAlAs and may further include intrinsic layers and quantum-well layers.

The various embodiments described above allow for a simply fabricated and thus inexpensive array of lasers having multiple emission wavelengths. Only minor variations from standard processing techniques are required, which variations do not have an appreciable effect on the high-performance characteristics of known vertical-cavity, surface-emitting lasers.

What is claimed is:

1. A multiple-wavelength array of optical devices, comprising:

a substrate including a crystalline surface;

an array of a plurality of semiconductor optical devices at least partially epitaxially formed on said crystalline surface, each of said optical devices comprising a pair of reflectors disposed apart from each other for at least partially reflecting light at a wavelength, optical cavities being formed in respective ones of said optical devices by respective pairs of said reflectors and having respective effective optical lengths corresponding to respective ones of said wavelengths;

wherein said effective optical lengths have different values varying in a predetermined relationship between respective ones of said optical devices and across said substrate, whereby said optical devices operate upon light in a predetermined distribution of a plurality of wavelengths corresponding to said predetermined relationship of said values of said effective optical lengths.

2. A laser array as recited in claim 1, wherein each of said optical devices is a laser further comprising an active region disposed between said reflectors for emitting light at said wavelength and whereby said lasers emit light in said predetermined distribution of said plurality of wavelengths.

3. A laser array as recited in claim 2 wherein said lasers are arranged in a two-dimensional array.

4. A laser array as recited in claim 2 wherein said effective optical lengths vary monotonically from a first side to a second side of said substrate.

5. A laser array as recited in claim 2 wherein at least one of said reflectors is a Bragg reflector comprising a plurality of pairs of quarter-wavelength layers of differing refractive indices.

6. A laser array as recited in claim 5, wherein a thickness of at least one of said quarter-wavelength layers closest to said active region in said Bragg reflector has a thickness varying in a predetermined manner across said substrate.

7. A laser array as recited in claim 6, wherein said at least one of said quarter-wavelength layers comprises a plurality of said quarter-wavelength layers, the remaining of said quarter-wavelength layers in said Bragg reflector being of substantially uniform thickness over said substrate.

8. An array of optical devices as recited in claim 1, wherein said optical devices are arranged in a two-dimensional array.

9. A array of optical devices as recited in claim 1, wherein said effective optical lengths vary monotonically from a first side to a second side of said substrate.

* * * * *